United States Patent [19]

Gorshe

[11] Patent Number: 5,113,187
[45] Date of Patent: May 12, 1992

[54] CMI ENCODER CIRCUIT
[75] Inventor: Steven S. Gorshe, Beaverton, Oreg.
[73] Assignee: NEC America, Inc., Melville, N.Y.
[21] Appl. No.: 673,912
[22] Filed: Mar. 25, 1991
[51] Int. Cl.⁵ .............................................. H03M 5/14
[52] U.S. Cl. ......................................... 341/73; 341/94
[58] Field of Search ............................... 347/68, 73, 94

[56] References Cited
U.S. PATENT DOCUMENTS

| | | | |
|---|---|---|---|
| 3,555,195 | 1/1971 | Rester | 370/105.3 |
| 3,691,553 | 9/1972 | McIntosh | 341/68 |
| 3,893,171 | 7/1975 | Marshall et al. | 360/45 |
| 4,189,621 | 2/1980 | Scott | 375/23 |
| 4,442,528 | 4/1984 | Fukuda | 341/73 X |
| 4,556,868 | 12/1985 | Harle | 341/73 |
| 4,562,422 | 12/1985 | Pospischil | 341/73 |
| 4,728,929 | 3/1988 | Tanaka | 341/73 |
| 4,761,635 | 8/1988 | Arnaune | 341/73 |
| 4,783,786 | 11/1988 | Tsukakoshi | 371/55 |
| 4,873,524 | 10/1989 | Akkermans | 341/73 |
| 4,876,615 | 10/1989 | Chikashige | 360/43 |

Primary Examiner—A. D. Pellinen
Assistant Examiner—Marc S. Hoff
Attorney, Agent, or Firm—Sughrue, Mion, Zinn, Macpeak & Seas

[57] ABSTRACT

A circuit having a completely synchronous and digital implementation for encoding a stream of digital data (NRZ form) into the coded marked inversion (CMI) format. The circuit includes a state machine having a predetermined number of defined legal and illegal states, an illegal state detection circuit, and an output circuit. When the state machine enters an illegal state because of, for example, the effects of noise or distortion on the digital data signal, the illegal state detection circuit forces the state machine back into a legal state.

7 Claims, 3 Drawing Sheets

| STATE # | OUTPUT | | | | ILLEGAL STATE |
|---|---|---|---|---|---|
| | A | B | X | Y | |
| 0 | 0 | 0 | 0 | 0 | NO |
| 1 | 0 | 0 | 0 | 1 | YES |
| 2 | 0 | 0 | 1 | 0 | YES |
| 3 | 0 | 0 | 1 | 1 | NO |
| 4 | 0 | 1 | 0 | 0 | NO |
| 5 | 0 | 1 | 0 | 1 | YES |
| 6 | 0 | 1 | 1 | 0 | YES |
| 7 | 0 | 1 | 1 | 1 | NO |
| 8 | 1 | 0 | 0 | 0 | NO |
| 9 | 1 | 0 | 0 | 1 | YES |
| 10 | 1 | 0 | 1 | 0 | YES |
| 11 | 1 | 0 | 1 | 1 | NO |
| 12 | 1 | 1 | 0 | 0 | YES |
| 13 | 1 | 1 | 0 | 1 | NO |
| 14 | 1 | 1 | 1 | 0 | NO |
| 15 | 1 | 1 | 1 | 1 | YES |

FIG. 2

| FIGURE | PS | IS | NS (DI=0) | NS (DI=1) |
|---|---|---|---|---|
| 3A | 0 | 2 | 3 | 11 |
| 3B | 1 | 3 | 2 → 3 | 10 → 11 |
| 3C | 2 | 0 | 1 → 0 | 9 → 8 |
| 3D | 3 | 1 | 0 | 8 |
| 3E | 4 | 6 | 7 | 14 |
| 3F | 5 | 7 | 6 → 7 | 15 → 14 |
| 3G | 6 | 4 | 5 → 4 | 12 → 13 |
| 3H | 7 | 5 | 4 | 13 |
| 3I | 8 | 8 | 4 | 13 |
| 3J | 9 | 9 | 5 → 4 | 12 → 13 |
| 3K | 10 | 10 | 6 → 7 | 15 → 14 |
| 3L | 11 | 11 | 7 | 14 |
| 3M | 12 | 12 | 1 → 0 | 9 → 8 |
| 3N | 13 | 13 | 0 | 8 |
| 3O | 14 | 14 | 3 | 11 |
| 3P | 15 | 15 | 2 → 3 | 10 → 11 |

FIG. 3

CMI ENCODER CIRCUIT

BACKGROUND OF THE INVENTION

The present invention relates to a digital data encoding circuit and, in particular, to a synchronously operated, digital state machine circuit for encoding a succession of data bits from a Non-Return-to-Zero (NRZ) format to a Coded Marked Inversion (CMI) format.

In applications relating to the transmission of digital data, for example, across an optical fiber link, the format of the transmitted optical signal is always of concern. This is an important consideration because the decision circuitry in the receiver must be able to extract precise timing information from the incoming optical signal. Three main purposes of timing are to allow the signal to be sampled by the receiver at the time the signal-to-noise ratio is a maximum, to maintain the proper pulse spacing, and to indicate the start and end of each timing interval. In addition, since errors resulting from noise and distortion can occur in the signal detection process, it may be desirable for the optical signal to have an inherent error-detecting capability. These features can be incorporated into the data stream by encoding the signal according to, for example, the CMI format which is a well-known technique.

The CMI format is a two-level line code in which digital data is converted into a pair of data bits. An example of a stream of digital data being converted from the NRZ format to the CMI format is shown in FIG. 5. Specifically, a data bit of "0" is converted into a pair of data bits "0,1", and a data bit of "1" is converted alternately into a pair of data bits "0,0" and "1,1". The pair of data bits "1,0" is, by definition, an illegal combination. The converted pair of data bits (i.e., "0,1", "0,0", or "1,1") is transmitted within the same time frame or data period in which the digital data is applied to the encoding unit.

In general, circuits or transmitters which encode a stream of digital data from the NRZ format to the CMI format are known. For example, U.S. Pat. No. 4,189,621 to Scott describes a device for encoding NRZ data into the CMI format. Scott discloses a circuit providing first, second and third signal channels and an output gating circuit. The first signal channel includes an input connected to receive clock-related pulses and a delay circuit for delaying the clock-related pulses by a predetermined amount of time. The second signal channel includes an input connected to receive the clock-related pulses, an input connected to receive NRZ signals to be encoded in the CMI format, and other logic for deriving from the input NRZ signals a sequence of signals related to Return-to Zero (RZ) signals divided by two. The third signal channel is connected to receive NRZ signals and to derive signals related to these NRZ signals. The output gating circuit is connected to receive the signals from the three signal channels for logically combining the output signals from the second and third signal channels in order to derive a sequence of control signals to be supplied to a clock switching circuit connected to the first signal channel. The delay caused by the delay circuit to the clock-related pulses from the first signal channel relative to the delay of the control signals form the second and third signal channels is approximately plus/minus a quarter clock period. This delay circuit presents a major disadvantage in the Scott circuit. Delay circuits, particularly used for delaying clock signals as in Scott, introduce many uncertainties in digital circuits, and such circuits are considered inferior to a completely synchronous circuit. Moreover, delay circuits and the components within require very precise tolerances and, in general, are more expensive than in synchronous circuits. Accordingly, synchronous designs are preferred.

The device of Scott is further disadvantageous in that no means of minimizing the effects of noise is provided.

SUMMARY OF THE INVENTION

It is therefore an object of the present invention to provide a digital circuit for encoding a stream of NRZ data into the CMI format which is free of the above-mentioned problems and disadvantages.

The above and other objects of the invention are accomplished by a digital circuit consisting of a state machine, an illegal state detection circuit, and an output circuit. The state machine is responsive to a succession of NRZ data, an illegal state signal, a first clock, and a second clock, and it produces a plurality of outputs bits which collectively constitute an output. The output of the state machine is further characterized as having a predetermined number of possible states including a set of legal states and a set of illegal states. The illegal state detector is provided for detecting the illegal states and causing the state machine to transition from the illegal state back to one of the legal states. Finally, the output circuit, which includes an exclusive-OR gate, logically combines part of the state machine's outputs, thus forming a CMI encoded data bit.

A particular advantage of this invention is that the CMI encoding circuit is completely synchronous.

It is another advantage of this invention that the circuit can be constructed from standard digital parts. The encoder of the present invention is particularly useful when used in conjunction with a CMI decoder and clock recovery circuit as disclosed in my copending application Ser. No. 07/678,400 filed concurrently herewith. In the copending application, the CMI decoder and clock recovery circuit receives the CMI encoded data and decodes the CMI encoded data from the CMI format back to the NRZ format. In addition, the circuit recovers a data clock enabling the incoming data to be sampled at the appropriate time.

The above and other objects, features and advantages of the present invention will become more apparent from the following detailed description taken in conjunction with the accompanying drawings.

BRIEF DESCRIPTION OF THE DRAWINGS

FIG. 2 shows a state table indicating the possible states of the FIG. 1 embodiment after the falling edge of CLOCK.

FIG. 3 shows a state transition table of the FIG. 1 embodiment.

DESCRIPTION OF THE PREFERRED EMBODIMENT

Figure 1:
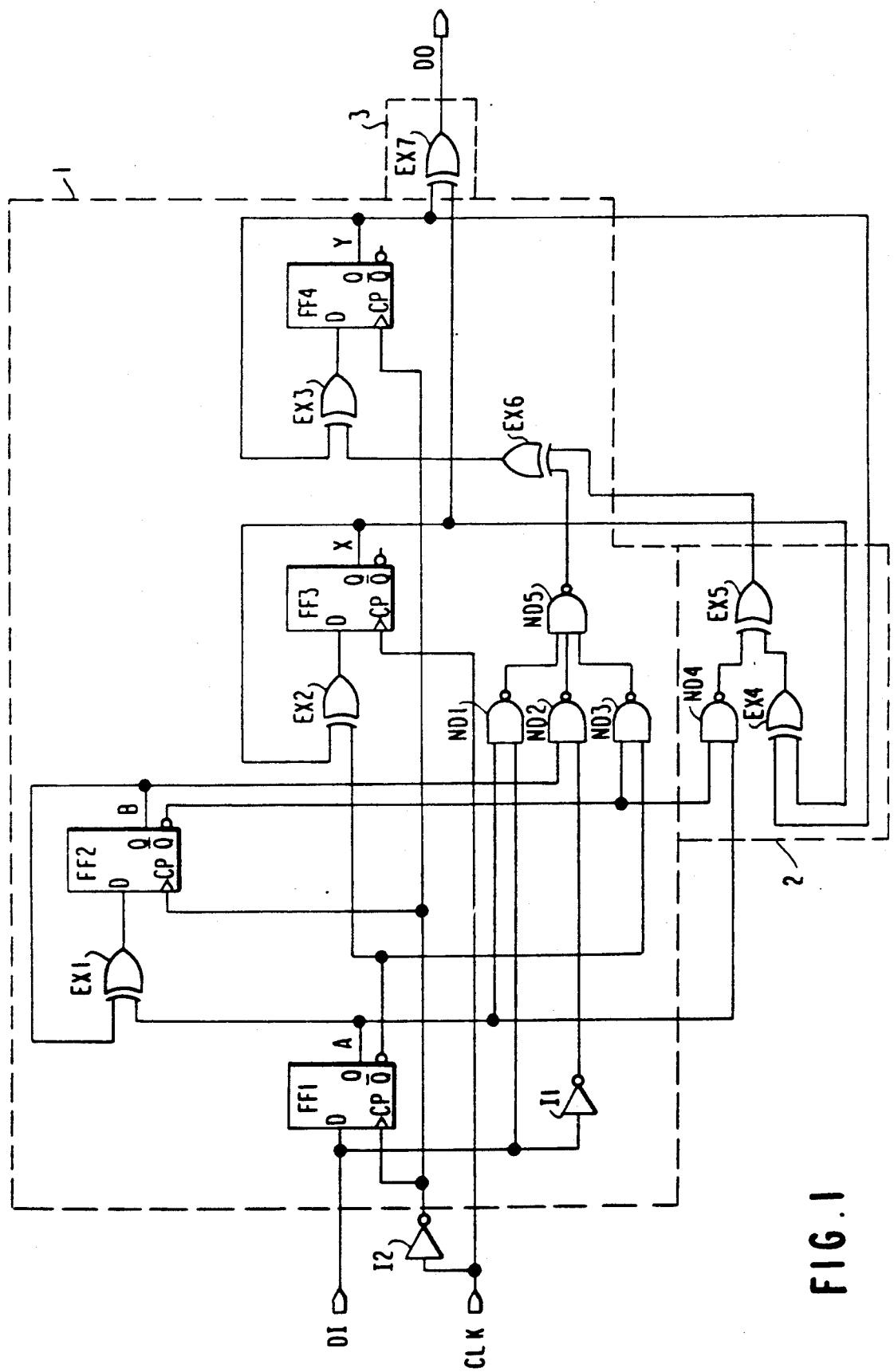
FIG. 1 shows a detailed schematic circuit diagram of a preferred embodiment of a CMI encoder circuit of the present invention.

Referring to FIG. 1, there is shown a preferred embodiment of a CMI encoder circuit of the present invention, which includes a state machine 1, an illegal state detection circuit 2, and an output circuit 3. More specifically, a stream of digital data DI to be encoded is applied to a D input of a first flip-flop FF1, a first input of a NAND gate ND1, and a second input of a NAND gate ND2 via an inverter I1. A non-inverting output A of the flip-flop FF1 is connected to a second input of the NAND gate ND1, a first input of an exclusive-OR gate EX1, and a first input of a NAND gate ND4. An inverting output A* (wherein * as used herein denotes an active low signal) of the flip-flop FF1 is connected to a first input of a second exclusive-OR gate EX2 and a NAND gate ND3. A D input of a second flip-flop FF2 is coupled to an output of the exclusive-OR gate EX1, whose second input is connected to a non-inverting output B of the same flip-flop FF2. The non-inverting output B of the flip-flop FF2 is also connected to a second input of the NAND gate ND2. An inverting output B* of the flip-flop FF2 is connected to respective second inputs of the NAND gates ND3 and ND4. A D input of a third flip-flop FF3 is coupled to an output of a second exclusive-OR gate EX2, whose second input is connected to a non-inverting output X of the same flip-flop FF3. The non-inverting output X is also connected to first inputs of exclusive-OR gates EX4 and EX7. A D input of a fourth flip-flop FF4 is similarly connected to an output of an exclusive-OR gate EX3 having a first input connected to a non-inverting output Y of the same flip-flop FF4. In addition, the non-inverting output Y is also connected to second inputs of the exclusive-OR gates EX4 and EX7. A second input of the exclusive-OR gate EX3 is connected to the output of another exclusive-OR gate EX6 whose inputs are respectively connected to the output of a NAND gate ND5 and the output of an exclusive-OR gate EX5 (i.e., the output of the illegal state detection circuit 2). Inputs of the NAND gate ND5 are respectively connected to outputs of NAND gates ND1-ND3. Inputs of the exclusive-OR gate EX5 are connected to outputs of the NAND gate ND4 and exclusive-OR gate EX4. An output of the exclusive-OR gate EX7 provides the CMI encoded data DO.

Clock inputs CP of the flip-flops FF1, FF2 and FF4 are connected to a clock signal CLK via an inverter I2, thereby providing synchronous operation. A clock input CP of the remaining flip-flop FF3 is connected directly to the clock signal CLK which is the logical complement of the clock signal provided to the flip-flops FF1, FF2 and FF4 (i.e., they are 180 degrees out of phase).

The respective outputs A, B, X, and Y of the flip-flops FF1-FF4 are considered critical points within the operation of the encoder circuit, particularly in the state machine 1, and will be referred to below while further explaining the operation of the CMI encoder circuit. Moreover, the outputs A, B*, X, and Y are inputs to the illegal state detection circuit 2, and outputs X and Y are inputs to the output circuit 3.

Referring to FIG. 2, a state table is shown representing the sixteen states that the outputs A, B, X, and Y can take. As shown, the state machine 1 has eight legal states (i.e., states 0, 3, 4, 7, 8, 11, 13 and 14) and eight illegal states (i.e., states 1, 2, 5, 6, 9, 10, 12 and 15). The legal states form a first closed state transition sequence, while the illegal states also form a separate closed state transition sequence. Therefore, assuming that the state machine 1 begins in a legal state, and further assuming a noise-free environment, the state machine will always transition from one legal state to another legal state and never encounter an illegal state. However, in a more practical situation, illegal states can and will be encountered because of excessive noise on the data DI received line or during the circuit's power-up. In either case, however, the illegal state detection circuit 2 will detect the illegal state and force the state machine 1 back into legal state.

Figure 4:
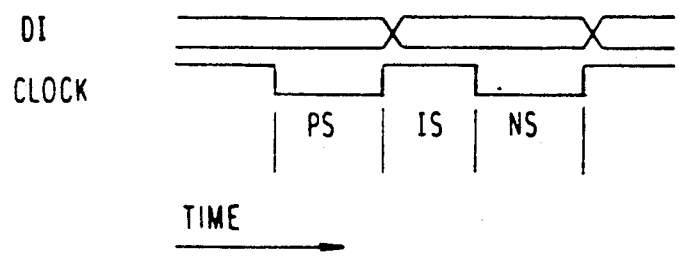
FIG. 4 shows a timing diagram relating to the state transition table of FIG. 3.
Figure 5:
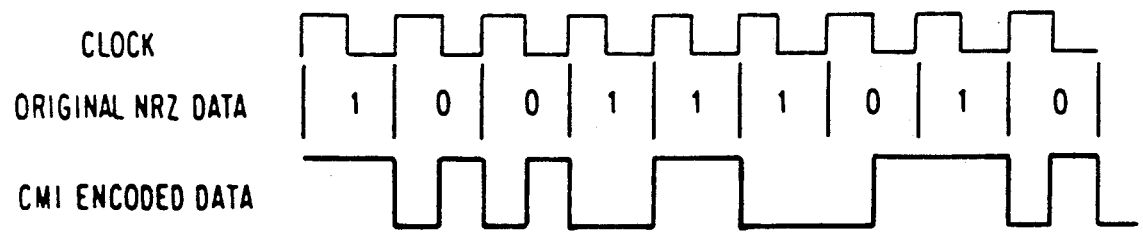
FIG. 5 shows a timing diagram representing a stream of NRZ data being CMI encoded.

To further understand the operation of the state machine 1, reference is made to the state transition table shown in FIG. 3. The three columns PS, IS, and NS respectively indicate the present state, intermediate state, and next state. FIG. 4 shows the relative timing between the states PS, IS, and NS with respect to a clock signal. The column NS is further broken down into two columns DI=0 and DI=1 distinguishing between the logical value of the incoming data DI during the present state PS. The output DO of the circuit within any data period can be determined by exclusive-OR'ing the outputs X and Y. More specifically, the output DO for the first and second half of the data period is determined by exclusive-OR'ing the outputs X and Y in the present state PS (first half) and exclusive-OR'ing the outputs X and Y in the intermediate state IS (second half).

The state transition table will now be described in more detail. In the first row (FIG. 3A), if the present state PS is STATE0, the state machine 1 will transition to STATE2 for the intermediate state IS and either STATE3 or STATE11 for the next state NS, depending on the logical value of the incoming data DI during the present state PS. That is, if the data DI received has a logical value of zero, then the next state NS will be STATE3 and if the logical value is one, the next state NS will be STATE11. Referring to the second row (FIG. 3B), if the present state PS is STATE1 (which is an illegal state), the state machine 1 will transition to an illegal intermediate state, STATE3. The next state NS will, as shown, further transition to one of the following illegal states, STATE2 (if DI=0) or STATE10 (if DI=1). Accordingly, because STATE2 and STATE10 are illegal states, the illegal state detection circuit 2 will force the state machine 1 back to a legal state. In this particular instance, the state machine 1 will be forced to either legal state, STATE3 (if DI=0), or legal state, STATE10 (if D1=1). There has thus been shown and described a novel CMI encoding circuit which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A CMI encoder comprising:
  state machine means responsive to a succession of NRZ data, an illegal state signal, a first clock, and a second clock for producing a plurality of output bits, said plurality of output bits collectively constituting an output having a predetermined number of possible states including a set of legal states and a set of illegal states, wherein said output of said state machine means transitions from one of said illegal states to one of said legal states in response to said illegal state signal;

illegal state detector means responsive to said output for detecting said illegal states and producing said illegal state signal, thereby causing said state machine to transition from said illegal state back to one of said legal states; and output means for logically combining a first portion of said plurality of output bits and outputting a CMI encoded data bit in response to said first portion of said plurality of output bits.

2. A CMI encoder as claimed in claim 1, wherein said legal states form a first closed-state transition sequence.

3. A CMI encoder as claimed in claim 1, wherein said illegal states form a closed-state transition sequence.

4. A CMI encoder as claimed in claim 1, wherein said illegal state detector means comprises:

a NAND circuit responsive to a second portion of said plurality of output bits and outputting a first signal;

a first exclusive-OR circuit responsive to said first portion of said plurality of output bits and outputting a second signal; and a second exclusive-OR circuit responsive to said first and second signals and outputting said illegal state signal.

5. A CMI encoder as claimed in claim 1, wherein said output means comprises:

an exclusive-OR circuit responsive to said first portion of said plurality of output bits for outputting said CMI encoded data bit.

6. A CMI encoder as claimed in claim 1, wherein said CMI encoder is a completely synchronous digital circuit.

7. A CMI encoder as claimed in claim 1, wherein said first clock is the logical complement of said second clock.

* * * * *